United States Patent
Nishida

(10) Patent No.: US 9,503,111 B2
(45) Date of Patent: Nov. 22, 2016

(54) ATOMIC OSCILLATOR

(71) Applicant: Seiko Epson Corporation, Tokyo (JP)

(72) Inventor: Tetsuo Nishida, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/865,102

(22) Filed: Sep. 25, 2015

(65) Prior Publication Data

US 2016/0094233 A1    Mar. 31, 2016

(30) Foreign Application Priority Data

Sep. 29, 2014  (JP) ................................. 2014-198723

(51) Int. Cl.
*H03L 7/26* (2006.01)
*G04F 5/14* (2006.01)

(52) U.S. Cl.
CPC .. *H03L 7/26* (2013.01); *G04F 5/14* (2013.01)

(58) Field of Classification Search
USPC ........................................................ 331/94.1
See application file for complete search history.

(56) References Cited

U.S. PATENT DOCUMENTS

| | | | |
|---|---|---|---|
| 4,597,638 A * | 7/1986 | Chemla | B82Y 20/00 359/244 |
| 6,172,570 B1 * | 1/2001 | Deng | G04F 5/14 331/3 |
| 6,201,821 B1 | 3/2001 | Zhu et al. | |
| 6,570,459 B1 | 5/2003 | Nathanson et al. | |
| 6,806,784 B2 | 10/2004 | Hollberg et al. | |
| 6,900,702 B2 | 5/2005 | Youngner et al. | |

FOREIGN PATENT DOCUMENTS

| | | |
|---|---|---|
| JP | 2007-336136 A | 12/2007 |
| JP | 2009-089116 A | 4/2009 |
| JP | 2009-164331 A | 7/2009 |
| JP | 2009-188598 A | 8/2009 |

* cited by examiner

*Primary Examiner* — Joseph Chang
(74) *Attorney, Agent, or Firm* — Harness, Dickey & Pierce, P.L.C.

(57) ABSTRACT

An atomic oscillator using a quantum interference effect, includes: a first light source unit emitting first light which includes a resonant light pair having two different wavelengths; a gas cell sealed with alkali metal atoms; a first light detection unit detecting a light intensity of the first light which is transmitted through the gas cell; a second light source unit emitting second light towards the gas cell; and a control unit changing a light intensity of the second light which is emitted from the second light source unit to compensate a change in the light intensity detected by the first light detection unit.

9 Claims, 5 Drawing Sheets

ATOMIC OSCILLATOR

BACKGROUND

1. Technical Field

The present invention relates to an atomic oscillator.

2. Related Art

An atomic oscillator in which transition energy of an atom is used as a reference frequency is widely used in a communication base station or the like as one of the most accurate oscillators. There are several types of atomic oscillators, and a microwave dual resonant type atomic oscillator using a rubidium (Rb) lamp is generally used the most.

Recently, an atomic oscillator using a phenomenon referred to as Coherent Population Trapping (CPT) which is one of quantum interference effects is proposed (for example, refer to JP-A-2009-89116), and thus a reduction in the size of the atomic oscillator and low power consumption are expected compared to the related art. In a case of a CPT type atomic oscillator, a high frequency signal is superimposed by using a coherent light source such as a laser as a light source, and thus a side band thereof is used in the expression of the CPT phenomenon. The CPT type atomic oscillator is an oscillator using an Electromagnetically Induced Transparency phenomenon (an EIT phenomenon) which stops absorption of light coherent when an alkali metal atom is irradiated with the coherent light having two different wavelengths (frequencies).

In the CPT type atomic oscillator, in general, a central frequency of laser light with which the gas cell is irradiated is controlled in order to increase a frequency stability degree of the atomic oscillator. The central frequency of the laser light is controlled by changing a bias current of the laser.

However, in the above-described atomic oscillator, the bias current of the laser is changed in order to control the central frequency of the laser light, and thus a light quantity of the laser is changed. For this reason, in the above-described atomic oscillator, a light shift (a phenomenon in which a resonant frequency is changed due to an AC stark effect) may occur.

SUMMARY

An advantage of some aspects of the invention is to provide an atomic oscillator which is able to suppress an occurrence of a light shift.

An atomic oscillator according to an aspect of the invention is an atomic oscillator using a quantum interference effect and including: a first light source unit emitting first light which includes a resonant light pair having two different wavelengths; a gas cell sealed with alkali metal atoms; a first light detection unit detecting a light intensity of the first light which is transmitted through the gas cell; a second light source unit emitting second light towards the gas cell; and a control unit changing a light intensity of the second light which is emitted from the second light source unit to compensate a change in the light intensity detected by the first light detection unit.

In such an atomic oscillator, for example, even when the light intensity of the first light is changed by changing an injected current of the first light source unit in order to control a central wavelength of the first light which is emitted from the first light source unit, it is possible to control the light intensity of the second light such that the sum of the light intensities of the light with which the gas cell is irradiated is constant by changing the light intensity of the second light. Further, in such a atomic oscillator, for example, even when the light intensity of the first light is not able to be maintained to be constant due to a secular change in the first light source unit, it is possible to control the light intensity of the second light such that the sum of the light intensities with which the gas cell is irradiated is constant by changing the light intensity of the second light. Therefore, in such an atomic oscillator, it is possible to suppress an occurrence of a light shift.

In the atomic oscillator according to aspect of the invention, the first light source unit and the second light source unit may be coherent light sources.

In such an atomic oscillator, the first light source unit and the second light source unit are able to emit light having high coherence.

In the atomic oscillator according to aspect of the invention, a wavelength of the second light is different from the two different wavelengths of the resonant light pair.

In such an atomic oscillator, it is possible to prevent an electron at a ground level of the alkali metal atom of the gas cell from being depleted.

In the atomic oscillator according to aspect of the invention, the second light source unit may be driven by being injected with a current in a range in which current-light intensity characteristics are in a linear shape.

In such an atomic oscillator, the light intensity of the second light which is emitted from the second light source unit is easily controlled.

In the atomic oscillator according to aspect of the invention, laser properties of the first light source unit may be identical to laser properties of the second light source unit.

In such an atomic oscillator, a circuit for driving the first light source unit and the second light source unit is easily designed.

In the atomic oscillator according to aspect of the invention, an optical axis of the first light may intersect with an optical axis of the second light in the gas cell.

In such an atomic oscillator, it is possible to prevent the second light from being incident on the first light detection unit.

In the atomic oscillator according to aspect of the invention, the optical axis of the first light may be orthogonal to the optical axis of the second light in the gas cell.

In such an atomic oscillator, it is possible to more reliably prevent the second light from being incident on the first light detection unit.

In the atomic oscillator according to aspect of the invention, the atomic oscillator may further include a second light detection unit detecting the light intensity of the second light which is emitted from the second light source unit.

In such an atomic oscillator, the control unit is able to control the light intensity of the second light such that the sum of the light intensity detected by the first light detection unit and the light intensity detected by the second light detection unit is constant.

In the atomic oscillator according to aspect of the invention, the second light detection unit may detect the light intensity of the second light which is transmitted through the gas cell.

In such an atomic oscillator, the second light detection unit is able to more reliably detect the light intensity of the second light with which the gas cell is irradiated.

In the atomic oscillator according to aspect of the invention, the control unit may control the light intensity of the second light which is emitted from the second light source unit such that a sum of the light intensity detected by the first light detection unit and the light intensity detected by the second light detection unit is constant.

In such an atomic oscillator, it is possible to suppress the occurrence of the light shift.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail with reference to the drawings. Furthermore, the embodiment described below does not unduly limit the contents of the invention described in the appended claims. In addition, it is not limited that all of the configurations described below are essential components of the invention.

1. Atomic Oscillator

Figure 1:
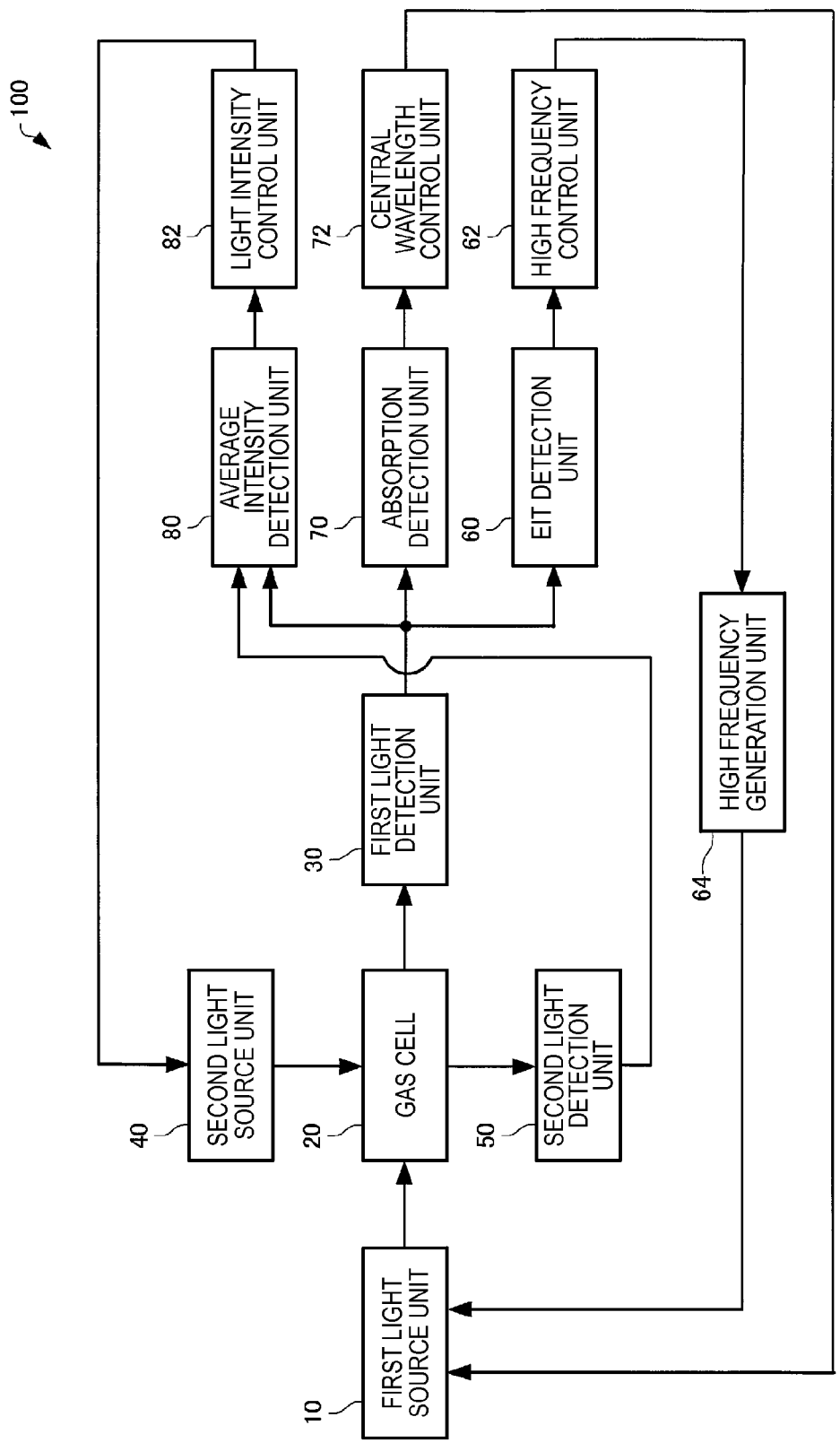
FIG. 1 is a functional block diagram of an atomic oscillator according to this embodiment.

First, an atomic oscillator according to this embodiment will be described with reference to the drawings. FIG. 1 is a functional block diagram of an atomic oscillator 100 according to this embodiment.

As illustrated in FIG. 1, an atomic oscillator 100 includes a first light source unit 10, a gas cell 20, a first light detection unit 30, a second light source unit 40, a second light detection unit 50, an EIT detection unit 60, a high frequency control unit 62, a high frequency generation unit 64, an absorption detection unit 70, a central wavelength control unit 72, an average intensity detection unit 80, and a light intensity control unit 82. The atomic oscillator 100 is an atomic oscillator using a quantum interference effect.

Figure 2:
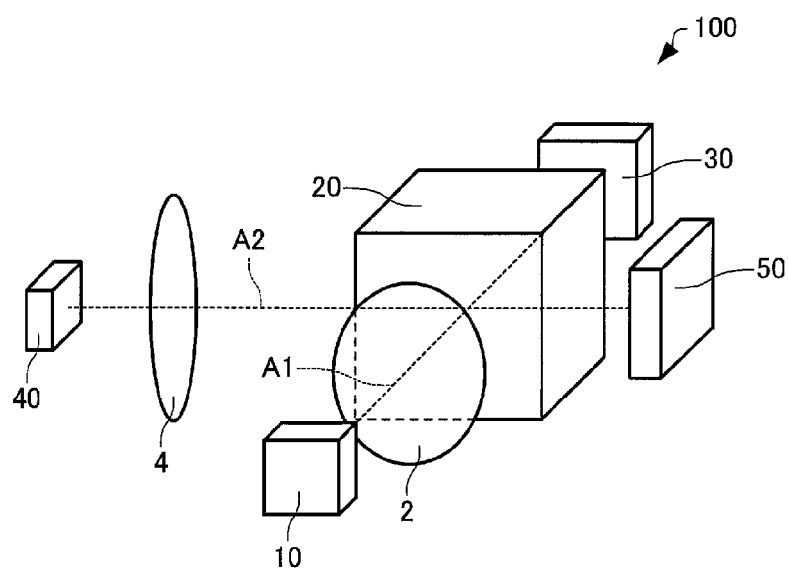
FIG. 2 is a perspective view schematically illustrating a light source unit, a gas cell, and a light detection unit of the atomic oscillator according to this embodiment.
Figure 3:
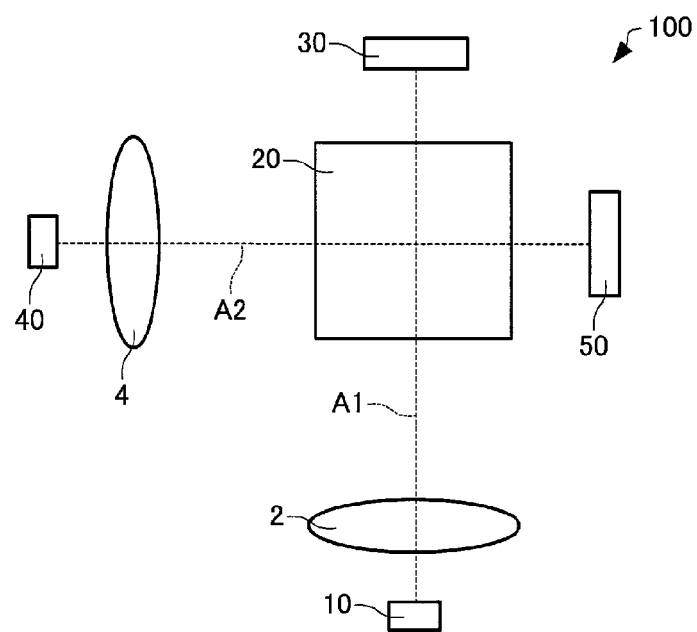
FIG. 3 is a plan view schematically illustrating the light source unit, the gas cell, and the light detection unit of the atomic oscillator according to this embodiment.

Here, FIG. 2 is a perspective view schematically illustrating the light source units 10 and 40, the gas cell 20, and the light detection units 30 and 50. FIG. 3 is a plan view schematically illustrating the light source units 10 and 40, the gas cell 20, and the light detection units 30 and 50.

The first light source unit 10 is a coherent light source. Specifically, the first light source unit 10 is a surface emitting laser (a Vertical Cavity Surface Emitting Laser (VCSEL)). An oscillation wavelength of the first light source unit 10, for example, is 852 nm. Furthermore, the coherent light source includes a light source emitting completely coherent light, and a light source emitting light having high coherence such as laser light.

The first light source unit 10 emits first light L1 which includes a resonant light pair having two different wavelengths. The gas cell 20 sealed with alkali metal atoms is irradiated with the first light L1. In examples illustrated in FIG. 2 and FIG. 3, the gas cell 20 is irradiated with the first light L1 by condensing the first light L1 on a condensing lens 2.

Figure 4:
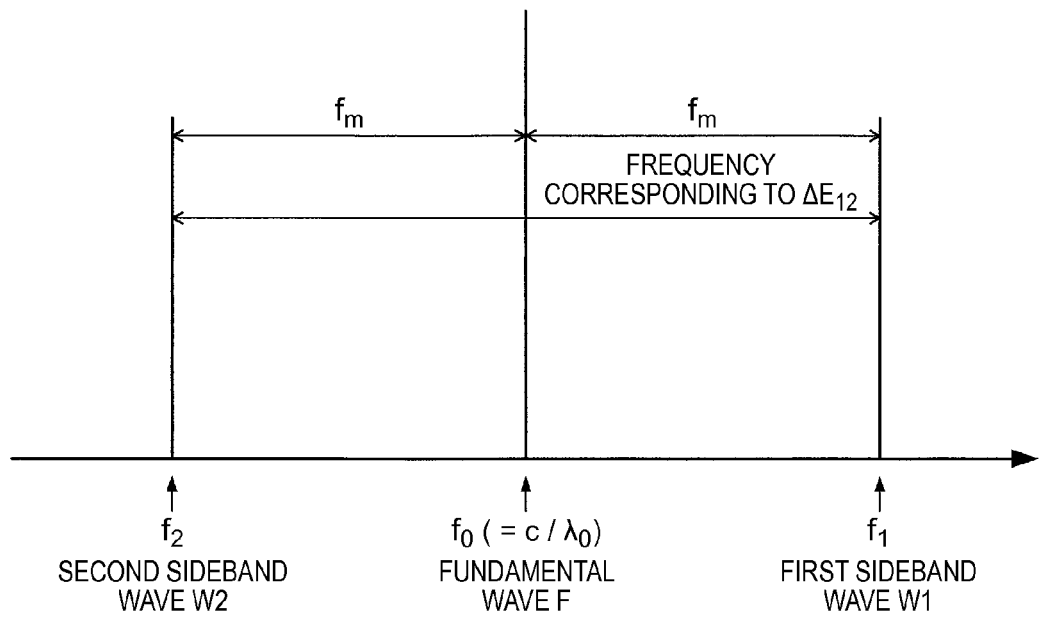
FIG. 4 is a diagram illustrating a frequency spectrum of resonant light.
Figure 5:
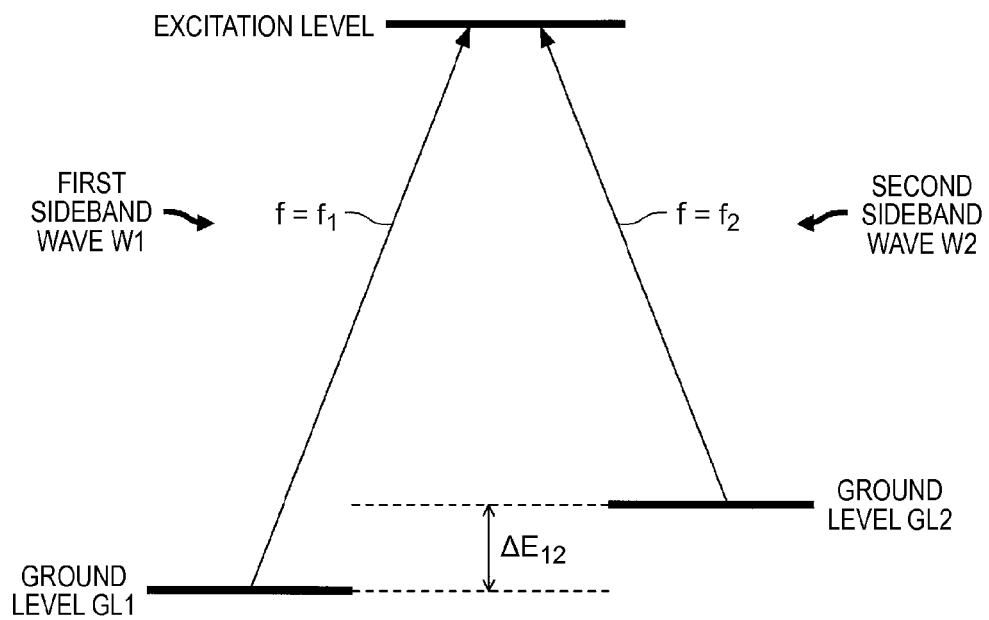
FIG. 5 is a diagram illustrating a relationship between a κ type 3-level model of an alkali metal atom, and a first sideband wave and a second sideband wave.

Here, FIG. 4 is a diagram illustrating a frequency spectrum of the resonant light. FIG. 5 is a diagram illustrating a relationship between a Λ type 3-level model of the alkali metal atom, and a first sideband wave W1 and a second sideband wave W2. The first light L1 emitted from the first light source unit 10 includes a fundamental wave F including a central frequency $f_0$ ($=c/\lambda_0$: c is a speed of light, and $\lambda$ is a central wavelength of laser light), a first sideband wave W1 having a frequency $f_1$ in a upper sideband with respect to the central frequency $f_0$, and a second sideband wave W2 having a frequency $f_2$ in a lower sideband with respect to the central frequency $f_0$, which are illustrated in FIG. 4. The frequency $f_1$ of the first sideband wave W1 is $f_1=f_0+f_m$, and the frequency $f_2$ of the second sideband wave W2 is $f_2=f_0-f_m$. The resonant light pair of the first light L1 corresponds to the sideband waves W1 and W2.

As illustrated in FIG. 5, a frequency difference between the frequency $f_1$ of the first sideband wave W1 and the frequency $f_2$ of the second sideband wave W2 is coincident with a frequency corresponding to an energy difference $\Delta E_{12}$ between a ground level GL1 and a ground level GL2 of the alkali metal atom. Therefore, the alkali metal atom causes an EIT phenomenon due to the first sideband wave W1 having the frequency $f_1$ and the second sideband wave W2 having the frequency $f_2$.

Here, the EIT phenomenon will be described. It is known that a mutual interaction between the alkali metal atom and the light is able to be described by a Λ type 3-level system model. As illustrated in FIG. 5, the alkali metal atom has two ground levels, and when the alkali metal atom is irradiated each independently with the first sideband wave W1 having a wavelength (the frequency $f_1$) corresponding to an energy difference between the ground level GL1 and an excitation level or the second sideband wave W2 having a wavelength (the frequency $f_2$) corresponding to an energy difference between the ground level GL2 and the excitation level, light absorption occurs. However, as illustrated in FIG. 4, when the alkali metal atom is concurrently irradiated with the first sideband wave W1 and the second sideband wave W2 in which a frequency difference $f_1-f_2$ is accurately coincident with a frequency corresponding to the energy difference $\Delta E_{12}$ between the ground level GL1 and the ground level GL2, the alkali metal atom is in a state where the two ground levels are superimposed, that is, in a quantum interference state, and thus a transparency phenomenon (the EIT phenomenon) occurs in which excitation to the excitation level stops and the first sideband wave W1 and the second sideband wave W2 are transmitted through the alkali metal atom. By using the EIT phenomenon, a rapid change in light absorption behavior at the time that the frequency difference $f_1-f_2$ between the first sideband wave W1 and the second sideband wave W2 is shifted from the frequency corresponding to the energy difference $\Delta E_{12}$ between the ground level GL1 and the ground level GL2 is detected and controlled, and thus a highly accurate oscillator is able to be manufactured.

The gas cell 20 is configured by sealing a container with gaseous alkali metal atoms (sodium atoms, rubidium atoms, cesium atoms, and the like). For example, by heating the alkali metal atoms in the container to approximately 80° C., the gaseous alkali metal atoms are able to be obtained. When the gas cell 20 is irradiated with two light waves (the resonant light pair W1 and W2) having a frequency (a wavelength) corresponding to the energy difference between the two ground levels of the alkali metal atom, the alkali metal atom causes the EIT phenomenon. For example, when the alkali metal atoms are cesium atoms, the frequency corresponding to the energy difference between the ground level GL1 and the ground level GL2 in a line D1 is 9.19263 . . . GHz, and thus when the alkali metal atom is irradiated with the two light waves in which the frequency difference is 9.19263 . . . GHz, the EIT phenomenon occurs.

The first light detection unit 30 detects the light intensity of the first light L1 which is transmitted through the gas cell 20. The first light detection unit 30 outputs a detection signal according to a quantity of the light which is transmitted through the alkali metal atom. The first light detection unit 30, for example, is a photodiode formed of silicon. As illustrated in FIG. 2 and FIG. 3, the first light source unit 10, the gas cell 20, and the first light detection unit 30 are linearly arranged along an optical axis A1 of the first light L1. Furthermore, the optical axis is an optical axis of a representative light ray (for example, a light ray having the strongest light intensity) of the light (a light flux) emitted from the light source unit.

The second light source unit 40 emits a second light L2 towards the gas cell 20. The second light source unit 40, for example, is a coherent light source. Specifically, the second light source unit 40 is a surface emitting laser. The wavelength of the second light L2, for example, is different from the two different wavelength of the resonant light pair W1 and W2. Specifically, the wavelength of the second light L2 (an oscillation wavelength of the second light source unit 40) is 850 nm.

Figure 6:
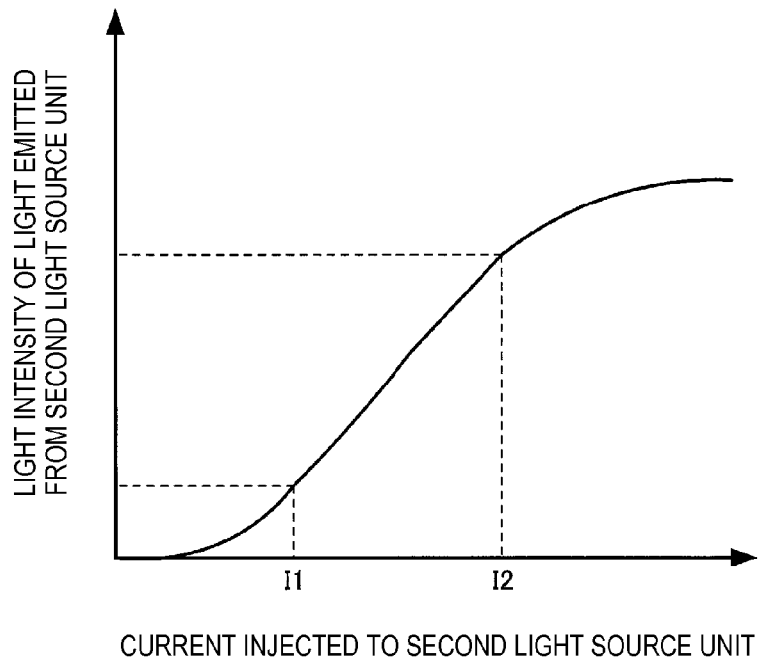
FIG. 6 is a graph schematically illustrating a relationship between a current injected to a second light source unit and a light intensity of second light emitted from the second light source unit.

Here, FIG. 6 is a graph schematically illustrating a relationship (current-light intensity characteristics) between a current injected to the second light source unit 40 (an injection current) and the light intensity of the second light L2 emitted from the second light source unit 40. As illustrated in FIG. 6, the current-light intensity characteristics of the second light source unit 40 are in a linear shape (a proportional relationship) in a range of greater than or equal to an injection current I1 and less than or equal to an injection current I2. The second light source unit 40 is driven by being injected with the current of greater than or equal to I1 and less than or equal to I2. That is, the second light source unit 40 is driven by being injected with the current in a range in which the current-light intensity characteristics are in a linear shape.

Laser properties of the second light source unit 40 are identical to laser properties of the first light source unit 10. Here, the laser properties are an emission pattern (a sectional shape of the emitted light), and the current-light intensity characteristics (for example, refer to FIG. 6). For example, the light source units 10 and 40 are surface emitting lasers having the same structure. Furthermore, the same laser properties include a case where the laser properties are completely identical to each other, and a case where the laser properties are substantially identical to each other. When the laser properties are substantially identical to each other, a difference in the laser properties may be due to a manufacturing error.

As illustrated in FIG. 2 and FIG. 3, an optical axis A2 of the second light L2 emitted from the second light source unit 40 intersects with the optical axis A1 of the first light L1 emitted from the first light source unit 10 in the gas cell 20. Specifically, the optical axis A1 of the first light L1 is orthogonal to the optical axis A2 of the second light L2 in the gas cell 20.

Furthermore, the second light source unit 40 may be not only the surface emitting laser, but also a Fabry-Perot laser. In addition, the second light L2 emitted from the second light source unit 40 may be not only light having a single wavelength, but also light having a plurality of wavelengths. In addition, the second light source unit 40 may be not only the coherent light source, but also a Light Emitting Diode (LED).

The gas cell 20 is irradiated with the second light L2 emitted from the second light source unit 40. In the examples illustrated in FIG. 2 and FIG. 3, the gas cell 20 is irradiated with the second light L2 by condensing the second light L2 on a condensing lens 4. The second light L2 may be or may not be absorbed in the alkali metal atom of the gas cell 20. The second light L2 is not resonant light having two different wavelengths.

The second light detection unit 50 detects the light intensity of the second light L2 emitted from the second light source unit 40. In the illustrated example, the second light detection unit 50 detects the light intensity of the second light L2 which is transmitted through the gas cell 20. The second light detection unit 50 outputs a detection signal according to a quantity of the light which is transmitted through the alkali metal atom. The second light detection unit 50, for example, is a photodiode formed of silicon. As illustrated in FIG. 2 and FIG. 3, the second light source unit 40, the gas cell 20, and the second light detection unit 50 are linearly arranged along the optical axis A2 of the second light L2.

Figure 7:
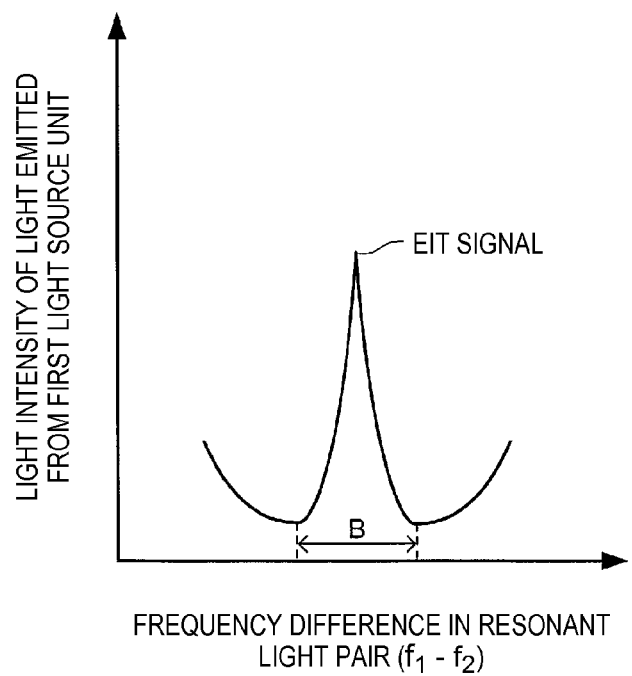
FIG. 7 is a graph schematically illustrating a relationship between a difference in frequencies of a resonant light pair and a light intensity.

The EIT detection unit 60 synchronously demodulates a detection signal from the first light detection unit 30, and detects the maximum value of an EIT signal. As illustrated in FIG. 7, the EIT signal is a rapid signal which is generated by the EIT phenomenon at the time of sweeping the difference $(f_1-f_2)$ in the frequency of the resonant light pair W1 and W2.

The high frequency control unit 62 outputs a signal which controls a frequency of a high frequency signal to the high frequency generation unit 64, on the basis of the signal from the EIT detection unit 60. Specifically, the high frequency control unit 62 controls the frequency of the high frequency signal generated by the high frequency generation unit 64 such that the frequency is a frequency corresponding to half of $\Delta E_{12}$ of the alkali metal atom of the gas cell 20, on the basis of a detection result of the EIT detection unit 60.

The high frequency generation unit 64 supplies the high frequency signal to the first light source unit 10 and generates the resonant light pair W1 and W2, on the basis of the signal from the high frequency control unit 62.

In the atomic oscillator 100, the resonant light pair of the first light L1 is controlled such that the resonant light pair is a resonant light pair which generates the EIT phenomenon in the alkali metal atoms sealing the gas cell 20 by a feedback loop (a first feedback loop) through the first light source unit 10, the gas cell 20, the first light detection unit 30, the EIT detection unit 60, the high frequency control unit 62, and the high frequency generation unit 64. Specifically, the frequency $f_m$ (refer to FIG. 4) is controlled such that the frequency $f_m$ is accurately coincident with ½ of a frequency (a resonant frequency) corresponding to $\Delta E_{12}$ (refer to FIG. 5) by the first feedback loop.

The absorption detection unit 70 synchronously demodulates the detection signal from the first light detection unit 30.

The central wavelength control unit 72 controls a direct current which is injected to the first light source unit 10 and supplies the direct current to the first light source unit 10, on the basis of the signal from the absorption detection unit 70. Accordingly, the central wavelength (the central frequency) of the first light L1 emitted from the first light source unit 10 is adjusted.

In the atomic oscillator 100, the central wavelength $\lambda_0$ (the central frequency $f_0$) of the first light L1 emitted from the first light source unit 10 is controlled by a feedback loop through the first light source unit 10, the gas cell 20, the first light detection unit 30, the absorption detection unit 70, and the central wavelength control unit 72. Specifically, the central wavelength $\lambda_0$ (=$c/f_0$) of the first light L1 emitted from the first light source unit 10 is controlled such that the central wavelength $\lambda_0$ (=$c/f_0$) is approximately coincident with $(\lambda_2+\lambda_2)/2$ (the central frequency $f_0$ is approximately coincident with $(f_1+f_2)/2$) with respect to a wavelength $\lambda_1$ (=$c/f1$) corresponding to the energy difference between the excitation level and one ground level of the alkali metal atoms sealing the gas cell 20 and a wavelength $\lambda_2$ (=$c/f_2$) corresponding to the energy difference between the excitation level and the other ground level by the second feedback loop.

The average intensity detection unit 80 changes the difference ($f_1-f_2$) in the frequencies of the resonant light pair W1 and W2 in a predetermined range, detects a light intensity in each frequency difference, and obtains the average of the light intensities of each of the frequency differences. As illustrated in FIG. 7, the range of the change in the frequency difference ($f_1-f_2$) of the resonant light pair W1 and W2, for example, is a range B between two points at which the light intensity of the first light is minimized. Further, the average intensity detection unit 80 detects a light intensity on the basis of the detection signal from the second light detection unit 50. Then, the average intensity detection unit 80 obtains the sum (the sum of the light intensities) of the light intensities (the average of the light intensities) detected by the first light detection unit 30 and the light intensity detected by the second light detection unit 50.

The light intensity control unit 82 controls a direct current which is injected to the second light source unit 40 and supplies the direct current to the second light source unit 40, on the basis of the signal of the average intensity detection unit 80. Accordingly, the light intensity of the second light L2 emitted from the second light source unit 40 is adjusted. Specifically, the light intensity control unit 82 changes the light intensity of the second light L2 to compensate a change in the light intensity detected by the first light detection unit 30, on the basis of the detection result of the average intensity detection unit 80. More specifically, the light intensity control unit 82 changes the light intensity of the second light L2, on the basis of the sum of the light intensities obtained by the average intensity detection unit 80. That is, the light intensity control unit 82 controls the light intensity of the second light L2 such that the sum of the light intensity detected by the first light detection unit and the light intensity detected by the second light detection unit 50 is constant.

Furthermore, the constant sum of the light intensities includes a case where the sum of the light intensities is completely constant and a case where the sum of the light intensities is substantially constant. The case where the sum of the light intensities is substantially constant is a case where a change rate of the sum of the light intensities (|Value before Change−Value after Change|/Value before Change) is less than or equal to 0.05.

The atomic oscillator 100, for example, has the following characteristics.

In the atomic oscillator 100, the light intensity control unit 82 changing the light intensity of the second light L2 which is emitted from the second light source unit 40 is provided in order to compensate the change in the light intensity detected by the first light detection unit 30. For this reason, in the atomic oscillator 100, for example, even when the injection current of the first light source unit 10 is changed and the light intensity of the first light L1 is changed in order to control the central wavelength of the first light L1 emitted from the first light source unit 10, the light intensity of the second light L2 is changed, and thus it is possible to control the sum of the light intensities of the light with which the gas cell 20 is irradiated such that the sum is constant. Further, in the atomic oscillator 100, for example, even when the light intensity of the first light L1 is not able to be maintained to be constant due to a secular change in the first light source unit 10, the light intensity of the second light L2 is changed, and thus it is possible to control the sum of the light intensities of the light with which the gas cell 20 is irradiated such that the sum is constant. Therefore, in the atomic oscillator 100, it is possible to suppress an occurrence of a light shift (a phenomenon in which a resonant frequency is changed due to an AC stark effect).

In the atomic oscillator 100, the first light source unit 10 and the second light source unit 40 are the coherent light sources. For this reason, the first light source unit 10 and the second light source unit 40 are able to emit light having high coherence.

In the atomic oscillator 100, the wavelength of the second light L2 is different from the two different wavelengths of the resonant light pair W1 and W2. For example, when the wavelength L2 of the second light is identical to at least one of the two different wavelengths of the resonant light pair W1 and W2, an electron at the ground level of the alkali metal atom of the gas cell 20 is excited by the second light L2, and thus the electron at the ground level may be depleted. Accordingly, the EIT phenomenon may not occur due to the resonant light pair W1 and W2. In the atomic oscillator 100, the wavelength of the second light L2 is different from the two different wavelengths of the resonant light pair W1 and W2, and thus it is possible to prevent the electron at the ground level from being depleted.

In the atomic oscillator 100, the second light source unit 40 is driven by being injected with the current in a range in which the current-light intensity characteristics are in a linear shape. For this reason, in the atomic oscillator 100, the light intensity of the second light L2 emitted from the second light source unit 40 is easily controlled.

In the atomic oscillator 100, the laser properties of the first light source unit 10 are identical to the laser properties of the second light source unit 40. For this reason, in the atomic oscillator 100, a circuit for driving the first light source unit 10 and the second light source unit 40 is easily designed. For example, when the current-light intensity characteristics of the two light source units are different from each other, it may be difficult to design the circuit for driving the two light source units.

In the atomic oscillator 100, the optical axis A1 of the first light L1 intersects with the optical axis A2 of the second light L2 in the gas cell 20. For this reason, in the atomic oscillator 100, it is possible to prevent the second light L2 from being incident on the first light detection unit 30. Accordingly, the first light detection unit 30 is able to accurately detect the light intensity of the first light L1 which is transmitted through the gas cell 20.

In the atomic oscillator 100, the optical axis A1 of the first light L1 is orthogonal to the optical axis A2 of the second light L2 in the gas cell 20. For this reason, it is possible to more reliably prevent the second light L2 from being incident on the first light detection unit 30.

In the atomic oscillator 100, the second light detection unit 50 detecting the light intensity of the second light L2 which is emitted from the second light source unit 40 is provided. For this reason, the light intensity control unit 82 is able to control the light intensity of the second light L2 such that the sum of the light intensity detected by the first light detection unit 30 and the light intensity detected by the second light detection unit 50 is constant.

In the atomic oscillator 100, the second light detection unit 50 detects the light intensity of the second light L2 which is transmitted through the gas cell 20. For this reason, the second light detection unit 50 is able to more reliably detect the light intensity of the second light L2 with which the gas cell 20 is irradiated.

2. Modification Example of Atomic Oscillator

2.1. First Modification Example

Figure 8:
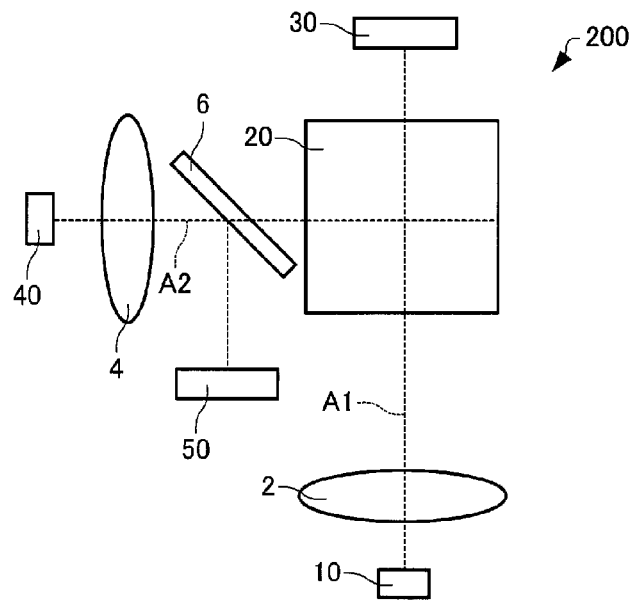
FIG. 8 is a plan view schematically illustrating a light source unit, a gas cell, and a light detection unit of an atomic oscillator according to a first modification example of this embodiment.

Next, an atomic oscillator of a first modification example of this embodiment will be described with reference to the drawings. FIG. 8 is a plan view schematically illustrating the light source units 10 and 40, the gas cell 20, and the light detection units 30 and 50 of an atomic oscillator 200 according to the first modification example of this embodiment.

Hereinafter, in the atomic oscillator 200 according to the first modification example of this embodiment, configurations different from the example of the atomic oscillator 100 according to this embodiment will be described, and the description of the same configurations will be omitted. The same applies to an atomic oscillator according to a second modification example of this embodiment described below.

As illustrated in FIG. 3, in the atomic oscillator 100 described above, the second light detection unit 50 detects the light intensity of the second light L2 which is transmitted through the gas cell 20. In contrast, as illustrated in FIG. 8, in the atomic oscillator 200, the second light detection unit 50 detects the light intensity of the second light L2 which is not transmitted through the gas cell 20.

In the atomic oscillator 200, a half mirror 6 is disposed between the second light source unit 40 and the gas cell 20. The second light detection unit 50 detects the second light L2 reflected on the half mirror 6. The gas cell 20 is irradiated with the second light L2 which is transmitted through the half mirror 6.

In the atomic oscillator 200, as with the atomic oscillator 100, it is possible to suppress the occurrence of the light shift.

2.2. Second Modification Example

Figure 9:
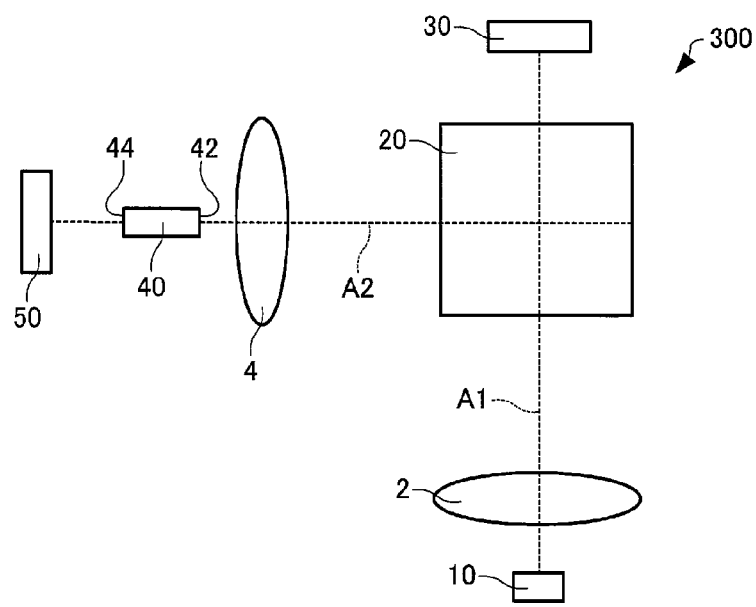
FIG. 9 is a plan view schematically illustrating a light source unit, a gas cell, and a light detection unit of an atomic oscillator according to a second modification example of this embodiment.

Next, an atomic oscillator according to a second modification example of this embodiment will be described with reference to the drawings. FIG. 9 is a plan view schematically illustrating the light source units 10 and 40, the gas cell 20, and the light detection units 30 and 50 of an atomic oscillator 300 according to the second modification example of this embodiment.

As illustrated in FIG. 3, in the atomic oscillator 100 described above, the second light detection unit 50 detects the light intensity of the second light L2 which is transmitted through the gas cell 20. In contrast, as illustrated in FIG. 9, in the atomic oscillator 300, the second light detection unit 50 detects the light intensity of the second light L2 which is not transmitted through the gas cell 20.

In the atomic oscillator 300, the second light detection unit 50 is disposed on a side of the second light source unit 40 opposite to the gas cell 20 side. That is, the second light source unit 40 is disposed between the gas cell 20 and the second light detection unit 50. The second light source unit 40, for example, is an Edge Emitting Laser. The second light source unit 40 emits the second light L2 from a first end surface 42 and a second end surface 44 which face each other. The second light L2 emitted from the first end surface 42 is incident on the gas cell 20. The second light L2 emitted from the second end surface 44 is incident on the second light detection unit 50.

In the atomic oscillator 300, as with the atomic oscillator 100, it is possible to suppress the occurrence of the light shift.

The embodiment and the modification examples are merely examples, and the invention is not limited thereto. For example, the respective embodiment and modification examples are able to be suitably combined.

The invention includes configurations (for example, configurations having the same functions, the same methods, and the same results, or configurations having the same objects and the same effects) which are substantially identical to the configurations described in the embodiment. In addition, the invention includes configurations in which unessential configurations described in the embodiment are replaced. In addition, the invention includes configurations which are able to obtain the same functional effect or to attain the same objects as that of the configurations described in the embodiment. In addition, the invention includes configurations in which a known technology is added to the configurations described in the embodiment.

The entire disclosure of Japanese Patent Application No. 2014-198723, filed Sep. 29, 2014 is expressly incorporated by reference herein.

What is claimed is:

1. An atomic oscillator using a quantum interference effect, comprising:
    a first light source emitting a first light, the first light including a pair of first and second resonant lights having first and second wavelengths, respectively, the first and second wavelengths being different from each other;
    a gas cell sealed with alkali metal atoms;
    a first light detector detecting a first light intensity of the first light which is transmitted through the gas cell;
    a second light source emitting a second light towards the gas cell, the second light having a second light intensity; and
    a controller being configured to keep a sum of the first and second light intensities constant by changing the second light intensity to a third light intensity to compensate a change in the first light intensity.

2. The atomic oscillator according to claim 1,
    wherein the first light source and the second light source are coherent light sources.

3. The atomic oscillator according to claim 2,
wherein a third wavelength of the second light is different from the first and second wavelengths.

4. The atomic oscillator according to claim 2,
wherein the second light is driven by being injected with a current in a range in which current-light intensity characteristics are in a linear shape.

5. The atomic oscillator according to claim 2,
wherein laser properties of the first light source are identical to laser properties of the second light source.

6. The atomic oscillator according to claim 1,
wherein an optical axis of the first light intersects with an optical axis of the second light in the gas cell.

7. The atomic oscillator according to claim 6,
wherein the optical axis of the first light is orthogonal to the optical axis of the second light in the gas cell.

8. The atomic oscillator according to claim 1, further comprising:
a second light detector detecting the second light intensity of the second light which is emitted from the second light source.

9. The atomic oscillator according to claim 8,
wherein the second light detector detects the second light intensity of the second light which is transmitted through the gas cell.

\* \* \* \* \*